(12) United States Patent
Edwards

(10) Patent No.: US 6,450,397 B1
(45) Date of Patent: Sep. 17, 2002

(54) METHOD OF MAKING BALL GRID ARRAY COLUMNS

(75) Inventor: Darvin R. Edwards, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/642,263

(22) Filed: Aug. 18, 2000

Related U.S. Application Data

(60) Provisional application No. 60/151,865, filed on Sep. 1, 1999.

(51) Int. Cl.⁷ .................................................. B23K 31/02
(52) U.S. Cl. .................................... 228/245; 228/180.22
(58) Field of Search .............................. 228/245, 173.2, 228/173.7, 254, 180.22, 56.3; 29/843, 874, 884

(56) References Cited

U.S. PATENT DOCUMENTS

| | | | | |
|---|---|---|---|---|
| 4,412,642 A | * | 11/1983 | Fisher, Jr. | |
| 4,664,309 A | * | 5/1987 | Allen et al. | |
| 4,914,814 A | * | 4/1990 | Behun et al. | |
| 5,718,367 A | * | 2/1998 | Covell, II et al. | |
| 5,735,452 A | * | 4/1998 | Yu et al. | |
| 6,105,851 A | * | 8/2000 | Norell et al. | |
| 6,112,976 A | * | 9/2000 | Achard et al. | |

* cited by examiner

Primary Examiner—M. Alexandra Elve
Assistant Examiner—Jonathan Johnson
(74) Attorney, Agent, or Firm—Wade James Brady, III; Frederick J. Telecky, Jr.

(57) ABSTRACT

A method of fabricating solder columns. The method includes the step of providing a substrate having predesignated locations thereon for fabrication of solder columns. An extrusion mold is provided which has apertures extending therethrough and a pair of opposing surfaces. The predesignated locations are aligned with the apertures along one of the surfaces and a solder tape is provided over the other of the opposing surfaces and over the apertures. The portion of the solder tape over the apertures is extruded through the apertures to the one of the surfaces. The portion of the solder tape is heated to at least its flow temperature by heating the substrate and optionally also heating the extrusion mold. The step of extruding comprises the steps of providing a plunger having a plurality of fingers, each finger aligned with an aperture and driving the fingers through the solder tape to drive the solder tape over the apertures to the one of the surfaces. The apertures have a continually increasing cross sectional area in a direction from the other of the opposing surfaces to the one of the opposing surfaces.

16 Claims, 1 Drawing Sheet

METHOD OF MAKING BALL GRID ARRAY COLUMNS

This application claims priority under 35 USC 119(e)(1) of provisional application No. 60/151,865 filed Sep. 1, 1999.

FIELD OF THE INVENTION

This invention relates to a method of making ball grid array columns for use in conjunction with integrated circuit packages.

BACKGROUND AND BRIEF DESCRIPTION OF THE PRIOR ART

Area array packaging is becoming increasingly used in integrated circuit packaging. The most prominent technology at present is the ball grid array package wherein solder balls are secured externally of the integrated circuit package and make contact with lead fingers of a lead frame within the package. The solder balls are then connected in standard manner to a printed circuit board or the like.

A problem associated with the use of such solder ball grid array packages is solder ball degradation due to high stresses. A geometrical approach which minimizes the stresses is to build solder columns rather than solder balls since the solder columns are more compliant than the solder balls and therefore absorb more stress with the use of less solder as compared with solder balls. Unfortunately, present technology makes the solder columns difficult to manufacture The prior art formation of such solder columns has involved loading a carrier with small sections of solder wire, reflowing one end of the solder wire to the substrate and then trimming the wire to size.

SUMMARY OF THE INVENTION

In accordance with the present invention, solder bumps can be made in a gang manner by extruding the bumps onto the substrate, this being very adaptable to high volume manufacturing. The bumps are formed as columns of solder by extruding the bumps in a gang process from a solder tape directly onto a heated substrate. The substrate may be heated, for example, by a heater placed against the substrate or closely thereto. The volume of the bump is determined by the solder tape thickness and the extrusion geometry. The height of the bump is dependent upon the amount of material available for extrusion, this in turn being dependent upon the solder thickness and the extrusion chamber geometry. The extrusion chamber is designed to clip the column out of any solder tape residue when the extrusion ram bottoms out. The extrusion mold may be optionally heated to improve solder flow, if required.

The procedure for fabricating the solder columns in the form of a ball grid array on a substrate is to provide a reel-to-reel solder tape indexer which will feed a tape of solder material and the tape. The tape is of predetermined thickness to provide, along with the geometry of the extrusion chamber, a predetermined amount of solder. The substrate, which can be the integrated circuit package, is lined up under the extrusion chamber so that the apertures extending through the extrusion chamber line up with the solder ball or column locations on the substrate. A heater is provided to heat the substrate to the flow temperature of the solder or, if the extrusion chamber is also heated, to a temperature sufficient to cause solder flow in conjunction with the heat provided by the extrusion chamber. The tape is placed over the extrusion chamber and over the apertures extending therethrough and a ram then enters the apertures in the extrusion chamber to force the portion of the tape extending over the apertures down through the apertures and onto the substrate. The solder will flow slightly due to the heat provided by the heater either alone or in conjunction with the heated extrusion chamber. After the solder has reflowed on the substrate, the substrate is removed from the heat sources and the solder thereon is allowed to cool and harden. The solder tape can then be refed by the tape indexer with the process repeated on a further substrate. The above described procedure provides solder columns of uniform volume and height and directly attaches the columns to the substrate in one process. Missing columns from the array are eliminated by the extrusion/pinch-off process.

Advantages of the above described procedure are high speed, low cost with unused solder tape being reworkable into additional solder tape. Solder tapes coated with foils of different metallurgies may be used for special bonding processes.

DESCRIPTION OF THE PREFERRED EMBODIMENT

Figure 1:
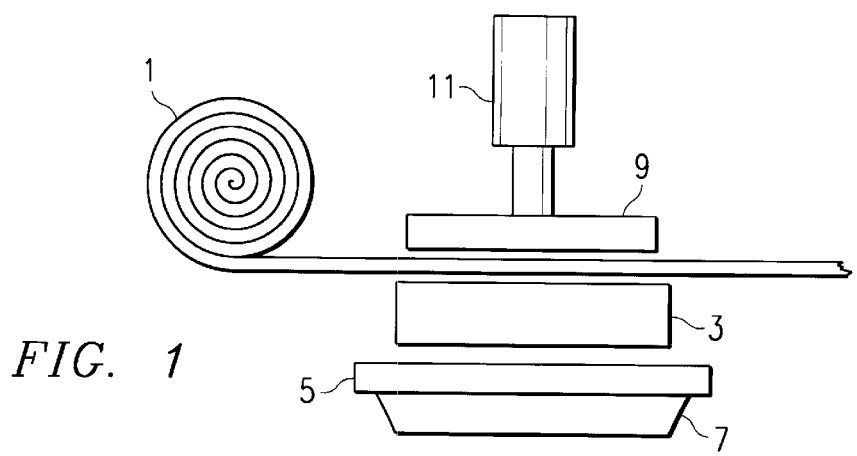
FIG. 1 is a schematic diagram of a system for providing solder columns on a substrate in accordance with the present invention.

Referring first to FIG. 1, there is shown a system for providing solder columns in accordance with the present invention. The is shown a reel of solder tape 1 which is fed in sections by an indexer (not shown) over an extrusion mold 3 which has a plurality of apertures extending therethrough. The extrusion mold 3 can optionally be heated. A substrate 5 is disposed beneath the extrusion mold 3 with the apertures (shown in FIG. 2 as 13) therein aligned with solder column locations (locations on the substrate whereat solder columns are to be formed). The substrate 5 is heated by a heater 7 which is shown intimate with the substrate, but which can be spaced therefrom and which provides sufficient heat either alone or in conjunction with heat generated by the extrusion mold, if any, to cause solder contacting the surface of the substrate to flow on the substrate. A mold press plunger 9 includes fingers (not shown) which enter the apertures in the extrusion mold. The mold press plunger is driven by a hydraulic cylinder 11. The fingers, when entering the extrusion mold 3, sever a portion of the solder tape 1 and drive that portion of the solder tape to the surface of the substrate 5. When the column of solder reaches the heated surface of the substrate 5 the solder reflows onto solder lands on the substrate surface. The mold press plunger 9 under control of the hydraulic cylinder 11 is then lifted with any solder remaining in the mold flat being shaved off with a blade type device. The substrate is quenched below the solder reflow temperature and is removed from the mold area. The substrate 5 is then replaced with a new substrate, the solder tape 1 is indexed and the procedure is repeated.

It may be necessary to prepunch the solder tape 1 to insure the same quantity of solder flows into each aperture. It may also be necessary to anneal the columns to strengthen them in the event the damage from the extrusion is high.

Figure 2:
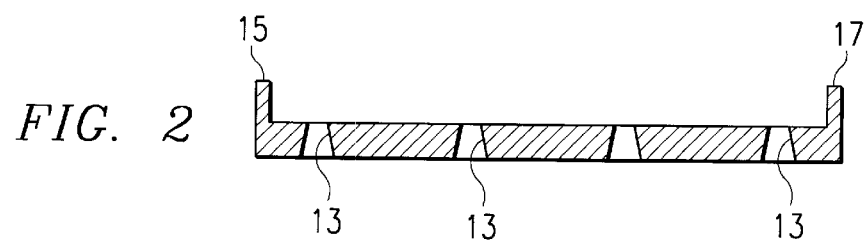
FIG. 2 is a cross sectional view of the extrusion mold of FIG. 1.

Referring to FIG. 2, there is shown a cross sectional view of the extrusion mold 3 of FIG. 1. The extrusion mold 5 has a plurality of apertures 13 and optional lips 15 and 17 extending above the upstream and downstream corners of the extrusion mold. The lips 15, 17 preferably have a height equal to the thickness of the solder tape whereby the solder tape is severed by the mold press plunger 9 when the plunger engages the extrusion mold. The apertures 13 are of frustoconical shape with the wider portion being located adjacent the substrate 5 and the narrower portion being located remote from the substrate. The purpose of the geometry is to prevent sticking of solder in the mold.

Figure 3:
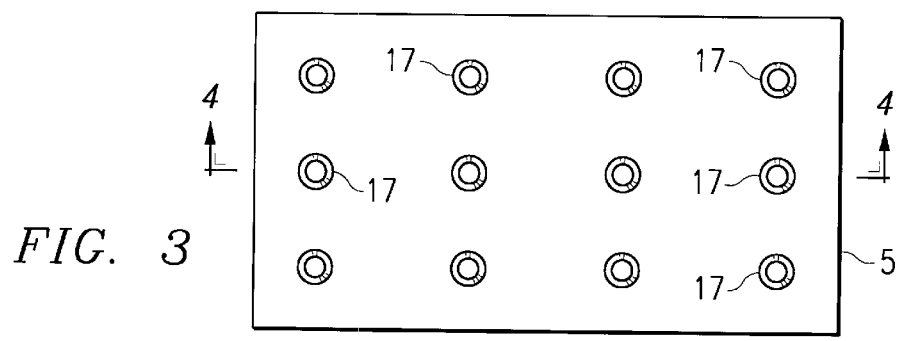
FIG. 3 is a top view of a substrate with solder columns thereon.
Figure 4:
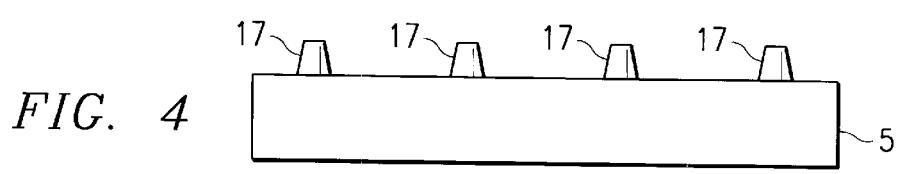
FIG. 4 is a cross-sectional view taken along the lines 4—4 of FIG. 3.

Referring to FIGS. 3 and 4, there are shown a top view and cross-sectional view of a substrate 5 having an array of solder columns 17 thereon. It can be seen that the solder columns 17 are capable of performing the same function as the ball grid array of the prior art, yet can be formed at substantially reduced cost.

Though the invention has been described with reference to a specific preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. A method of fabricating solder columns onto solder lands at designated locations of a semiconductor device surface, which comprises the steps of:
   (a) providing a substrate having said designated locations thereon for fabrication of solder columns;
   (b) providing an extrusion mold having apertures extending therethrough and a pair of opposing surfaces to which said apertures extend;
   (c) aligning said designated locations with said apertures along one of said surfaces of said extrusion mold;
   (d) providing a solder tape over the other of said opposing surfaces of said extrusion mold and over said apertures;
   (e) extruding the portion of said solder tape over said apertures through said apertures to said designated locations; and
   (f) permitting the portion of the solder tape extruded onto said designated locations to set.

2. The method of claim 1 further including the step of heating said portion of said solder tape to at least its flow temperature.

3. The method of claim 2 wherein said step of heating comprises the step of heating said substrate.

4. The method of claim 3 wherein said step of heating further comprises the step of heating said extrusion mold.

5. The method of claim 1 wherein said step of extruding comprises the steps of providing a plunger having a plurality of fingers, each finger aligned with a said aperture, and driving said fingers through said solder tape to drive said solder tape over said apertures to said one of said surfaces.

6. The method of claim 2 wherein said step of extruding comprises the steps of providing a plunger having a plurality of fingers, each finger aligned with a said aperture, and driving said fingers through said solder tape to drive said solder tape over said apertures to said one of said surfaces.

7. The method of claim 3 wherein said step of extruding comprises the steps of providing a plunger having a plurality of fingers, each finger aligned with a said aperture, and driving said fingers through said solder tape to drive said solder tape over said apertures to said one of said surfaces.

8. The method of claim 4 wherein said step of extruding comprises the steps of providing a plunger having a plurality of fingers, each finger aligned with a said aperture, and driving said fingers through said solder tape to drive said solder tape over said apertures to said one of said surfaces.

9. The method of claim 1 wherein said apertures have a continually increasing cross sectional area in a direction from said other of said opposing surfaces to said one of said opposing surfaces.

10. The method of claim 2 wherein said apertures have a continually increasing cross sectional area in a direction from said other of said opposing surfaces to said one of said opposing surfaces.

11. The method of claim 3 wherein said apertures have a continually increasing cross sectional area in a direction from said other of said opposing surfaces to said one of said opposing surfaces.

12. The method of claim 4 wherein said apertures have a continually increasing cross sectional area in a direction from said other of said opposing surfaces to said one of said opposing surfaces.

13. The method of claim 5 wherein said apertures have a continually increasing cross sectional area in a direction from said other of said opposing surfaces to said one of said opposing surfaces.

14. The method of claim 6 wherein said apertures have a continually increasing cross sectional area in a direction from said other of said opposing surfaces to said one of said opposing surfaces.

15. The method of claim 7 wherein said apertures have a continually increasing cross sectional area in a direction from said other of said opposing surfaces to said one of said opposing surfaces.

16. The method of claim 8 wherein said apertures have a continually increasing cross sectional area in a direction from said other of said opposing surfaces to said one of said opposing surfaces.

* * * * *